United States Patent [19]
Hashimoto

[11] Patent Number: 5,673,219
[45] Date of Patent: Sep. 30, 1997

[54] APPARATUS AND METHOD FOR REDUCING LEAKAGE CURRENT IN A DYNAMIC RANDOM ACCESS MEMORY

[75] Inventor: Masashi Hashimoto, Ibaraki, Japan

[73] Assignee: Texas Instruments Incorporated, Dallas, Tex.

[21] Appl. No.: 620,716

[22] Filed: Mar. 21, 1996

[51] Int. Cl.$^6$ .................................................. G11C 11/24
[52] U.S. Cl. ..................... 365/149; 365/189.09; 365/202
[58] Field of Search .......................... 365/149, 189.09, 365/202

[56] References Cited

U.S. PATENT DOCUMENTS

| | | | |
|---|---|---|---|
| 4,943,944 | 7/1990 | Sakui et al. | 365/149 |
| 5,138,578 | 8/1992 | Fujii | 365/149 |
| 5,247,482 | 9/1993 | Kim | 365/149 |
| 5,414,662 | 5/1995 | Foss et al. | 365/149 |

*Primary Examiner*—Son T. Dinh
*Attorney, Agent, or Firm*—Mark E. Courtney; W. James Brady, III; Richard L. Donaldson

[57] ABSTRACT

In a dynamic random access memory unit, the leakage current from a non-selected charged storage cell capacitor (320–324; 325–329) through the pass transistor (310–314; 315–319) to a zero voltage bitline (31, 32) is reduced by first isolating the bitline pair (31, 32) from the sense amplifier unit (35). The voltage of the zero voltage bitline (31, 32) is then increased so that the bitline (31, 32) is at a slightly higher potential than the gate terminal of the pass transistor (310, 314; 315–319). This voltage difference results in a large reduction of leakage current. In the preferred embodiment, a coupling transistor (304) is positioned between the bitline pair (31, 32). After the bitline pair (31, 32) is isolated from the associated sense amplifier unit 35, a small voltage is applied to the gate terminal of the coupling transistor (304). A small rise in the voltage of the zero voltage bitline (31, 32) results, thereby providing voltage difference between the gate and the source of the pass transistor (310, 314; 315, 319) to reduce the current flow.

22 Claims, 3 Drawing Sheets

APPARATUS AND METHOD FOR REDUCING LEAKAGE CURRENT IN A DYNAMIC RANDOM ACCESS MEMORY

BACKGROUND OF THE INVENTION

1. Field of the Invention

This invention relates generally to metal-oxide-semiconductor dynamic random access memory units, and, more particularly, to the leakage current which compromises the performance of integrated circuit dynamic random access memory (DRAM) devices.

2. Description of the Related Art

Referring first to FIG. 1, a portion of a storage cell subsystem used in dynamic random access memory units is shown. Storage capacitors 11 and 13 store a quantity of charge which is the physical analog of a logic state. N-channel field effect transistors 10 and 12 have one terminal of the source-drain path coupled to a bitline 15 and a second terminal of the source-drain path coupled to storage cell capacitors 11 and 13 respectively. A gate terminal of transistor 10 is coupled to wordline 16, while a gate terminal of transistor 12 is coupled to wordline 17. When wordline 16 has an ON signal applied thereto and capacitor 11 has charge stored thereon, charge flows to the bitline as indicated by the solid arrow in the vicinity of capacitor 11. When the word line 17 has an OFF signal (0volts) applied thereto, capacitor 13 has charge stored thereon and the bitline is at 0 volts potential, then leakage current, indicated by the dotted arrow, will flow from the capacitor to the bitline. This discussion is based on the assumption that a logic "1" data signal is stored in the memory cell.

This leakage current limits the performance of the dynamic random access memory device because, when not enough charge has left the capacitor, an access of the capacitor will be not accurately identify the logic state represented by the charge originally stored on the capacitor. The leakage current is the origin for the requirement for refresh apparatus and determines the length of time (data retention time parameter) which the memory unit can function accurately without a refresh cycle.

A need has therefore been felt for apparatus and an associated technique for reducing the leakage current with a minimum impact on performance and without an excessive amount of additional apparatus.

SUMMARY OF THE INVENTION

The aforementioned and other features are accomplished, according to the present invention, by providing a negative potential between the bitline and the bulk (or substrate) and gate of a non-selected pass transistor (having a storage cell capacitor with a logic "1" stored thereon). In the preferred embodiment, a coupling transistor is coupled between the bitline pair. After the bitline pair have been driven to the full logic state potential difference by the sense amplifier unit, after isolating the amplifier unit from the bitline, a gate of the coupling transistor coupled between the bitline pair has small voltage applied thereto. The small voltage applied to the gate results is a small potential increase in the potential of the bitline which has been driven to a zero potential by the sense amplifier unit. The small increase in potential provides a negative biasing of pass transistor bulk and gate relative to the source potential of the pass transistor. This biasing results in a reduction of the leakage current from the storage capacitor, thereby increasing the data time retention parameter. By reconnecting the amplifier unit at the end of an active cycle, a full level 0V or Vdd is written into the selected memory cell.

These and other features of the present invention will be understood upon the reading of the Specification in conjunction with the Figures.

DESCRIPTION OF THE PREFERRED EMBODIMENT(S)

Figure 1:
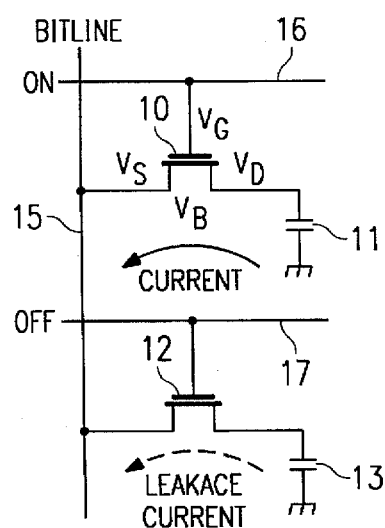
FIG. 1 is a schematic diagram of two storage cells in an integrated circuit semiconductor memory and associated apparatus.

1. Detailed Description of the Drawings FIGS. 1 has been described with respect to the prior art.

Figure 2:
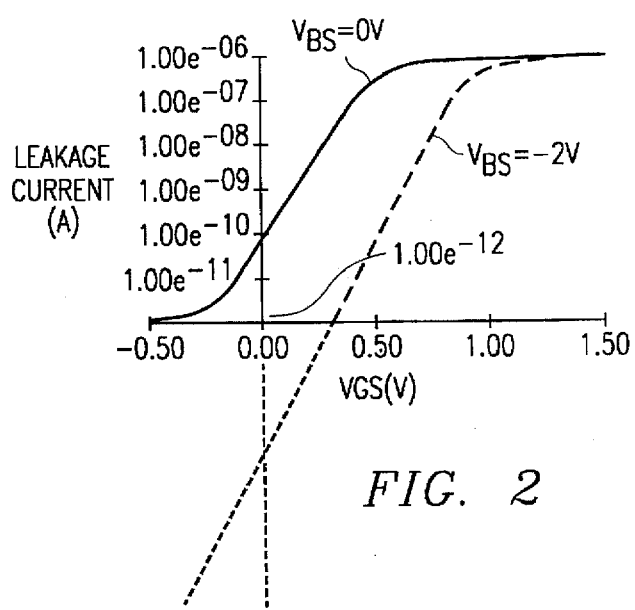
FIG. 2 is graph of illustrating the relationship between leakage current and the gate-source voltage for two values of bulk-source voltage.

Referring next to FIG. 2, a graph of the leakage current as a function of gate-to-source voltage (VGS) for two values of bulk-to-source potentials (VBS) is shown. This graph illustrates that, by increasing the bulk-to-source negative potential, the leakage current through a transistor can be reduced.

Figure 3:
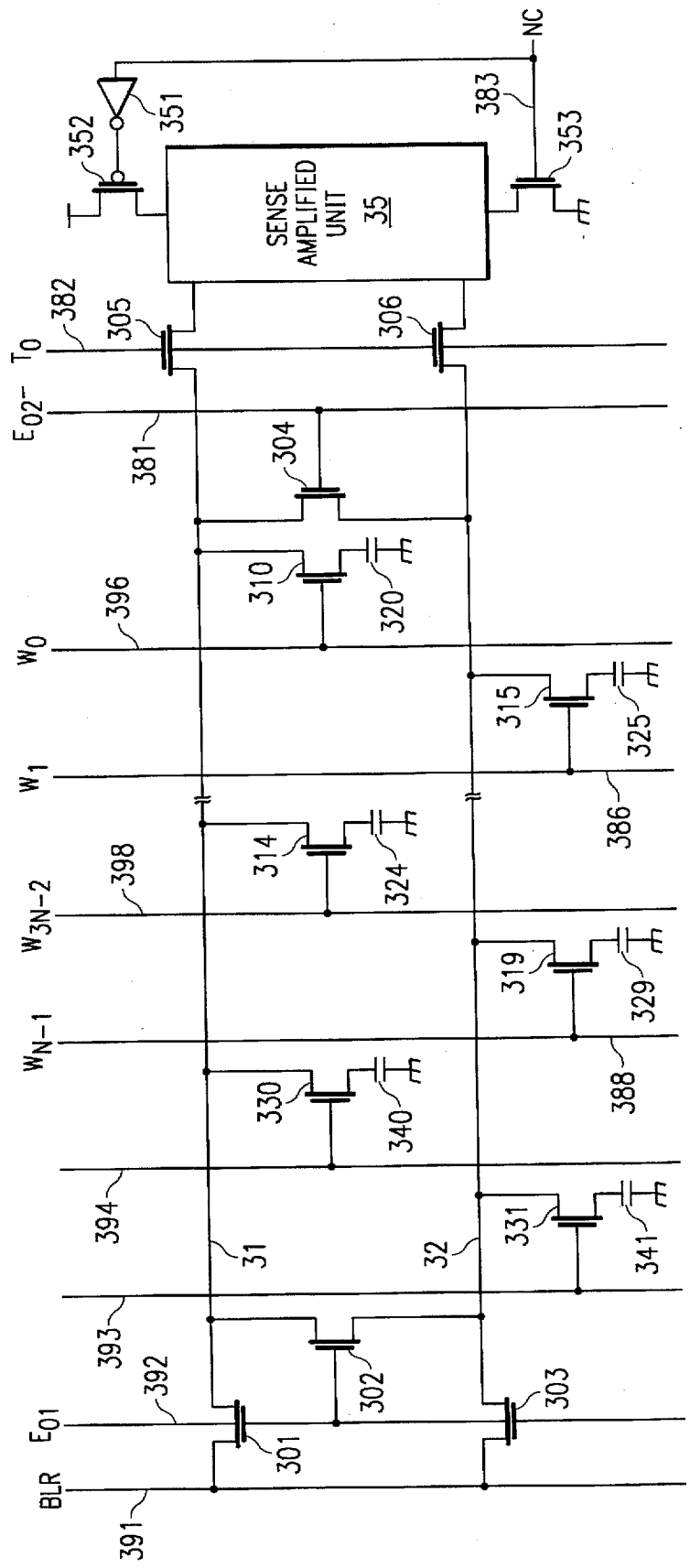
FIG. 3 is a schematic diagram of the apparatus for reducing leakage current according to the present invention.

Referring next to FIG. 3, an n-channel field effect transistor 305 has a first source-drain path terminal coupled to sense amplifier unit 35 and a second source-drain path terminal coupled to bitline 31. Also coupled to bitline 31 are a first source-drain path terminal of n-channel field effect transistor 304, first source-drain path terminals of n-channel field effect transistors 310 through 314, a first source-drain path terminal of n-channel field effect transistor 330, a first source-drain path terminal of n-channel field effect transistor 302 and a first source-drain path terminal of n-channel field effect transistor 301. A first source-drain path terminal of n-channel field effect transistor 306 is coupled to the sense amplifier unit 35, while a second source-drain path terminal of transistor 306 is coupled to bitline__32. Also coupled to bitline__32 is a second source-drain path terminal of n-channel field effect transistor 304, first source-drain path terminals of n-channel field effect transistors 315 through 319, a first source-drain path terminal of field effect transistor 331, a second source-drain path terminal of transistor 302, and a first source-drain path terminal of n-channel field effect transistor 303. Gate terminal of transistors 305 and 306 are coupled to conductor 382, conductor 382 having signal $T_O$ applied thereto. A gate terminal of transistor 304 is coupled to conductor 381, conductor 381 having signal $E_{O2}$__applied thereto. Second source-drain path terminals of transistors 310 through 314 are, respectively, coupled through storage cell capacitors 320 through 324 to the ground potential. Second source-drain terminals of transistors 315 through 319 are, respectively, coupled through storage cell capacitors 325 through 329 to the ground potential. Gate terminals of transistors 310 through 314 are, respectively, coupled to wordline conductors 396 through 398. Gate terminals transistors 315 through 319 are, respectively, coupled to wordline conductors 386 through 388. Transistor 330 has a second source-drain path terminal coupled through capacitor 340 to ground potential and has a gate terminal coupled to conductor 394. Transistor 331 has a second source-drain path terminal coupled through capacitor 341 to ground potential and has a gate terminal coupled to conductor 393. Gate terminals of transistors 301, 302, and 303 are all coupled conductor 392, conductor 392 having signal $E_{01}$ applied thereto. Second source-drain terminals of transistors 301 and 303 are coupled to conductor 391, conductor 391 having the BLR signal applied thereto. An NC signal is applied to an input terminal of inverting amplifier 351 and to a gate terminal of n-channel field effect transistor 353. A first source-drain path terminal of transistor 353 is coupled to the sense amplifier unit 35, while a second source-drain path terminal of transistor 353 is coupled to the ground potential. An output terminal of inverting amplifier 351 is coupled to a gate terminal of p-channel field effect transistor 352. A first source-drain path terminal of transistor 352 is coupled to sense amplifier unit 35, while a second source-drain path terminal of transistor 352 is coupled to a supply terminal.

Figure 4:
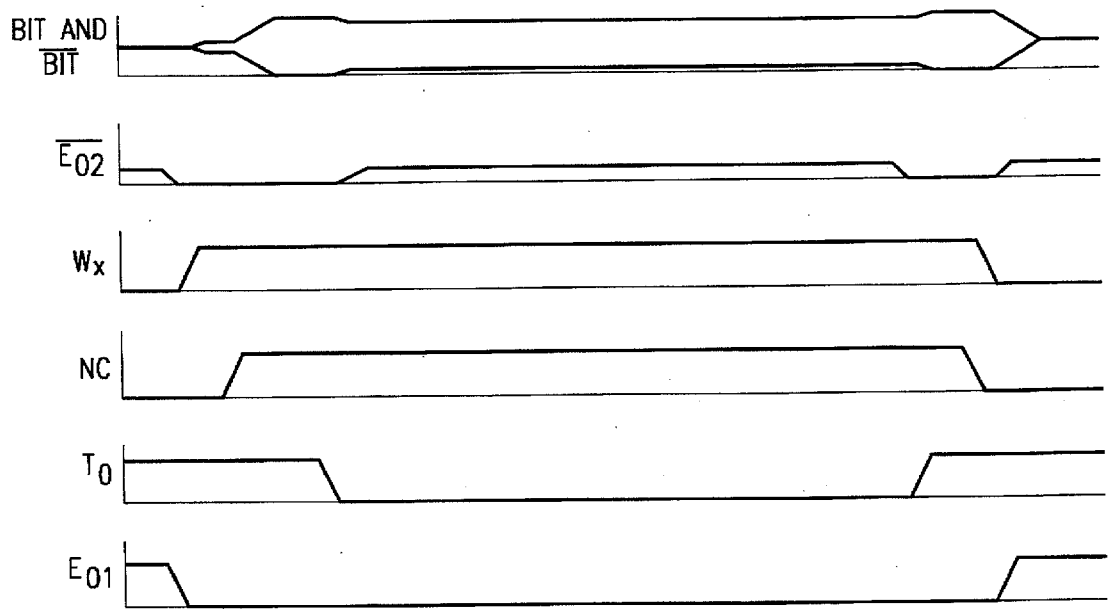
FIG. 4 is a graph illustrating the relationship of the activation signals and the resulting potentials of the apparatus of FIG. 3.

Referring to FIG. 4, the relationship of control voltages and the resulting activity in the storage cell is illustrated. The $E_{01}$ signal initially charges the bitline 31 and the bitline__32, resulting in a equal voltage on the bitline pair. The $E_{01}$ signal is removed trapping the equal voltage on the bitline pair. Simultaneously, the $E_{02}$__signal, which has been applied to the storage cell is removed. The selected wordline conductor signal $W_X$ is then applied to the associated pass transistor and the charge on the selected storage cell capacitor is applied to one member of the bitline pair. As a result of the application of charge to one bitline, the voltage BIT and BIT__on the bitline pair diverge slightly. The sense amplifier unit 35, activated by the NC signal, causes the voltage BIT and BIT__to diverge. Signal $T_O$ isolates the bitline pair from sense amplifier. The $E_{02}$__signal is reapplied and the difference between the BIT and the BIT__voltage is narrowed slightly. As a consequence the normally zero potential on one member of the bitline pair is raised slightly above zero. At the very end of the DRAM array active cycle, the $E_{02}$__signal is removed and the $T_O$ signal reapplied resulting in the full voltage difference between the BIT and the BIT__signals. In this manner a full power supply level or ground level is written into the selected memory array at the end of the DRAM array active cycle. The WX signal and the NC signal are reapplied. The $E_{01}$ signal and the $E_{02}$__signal are reapplied, thereby initializing the apparatus for a next access to a storage cell.

Figure 5:
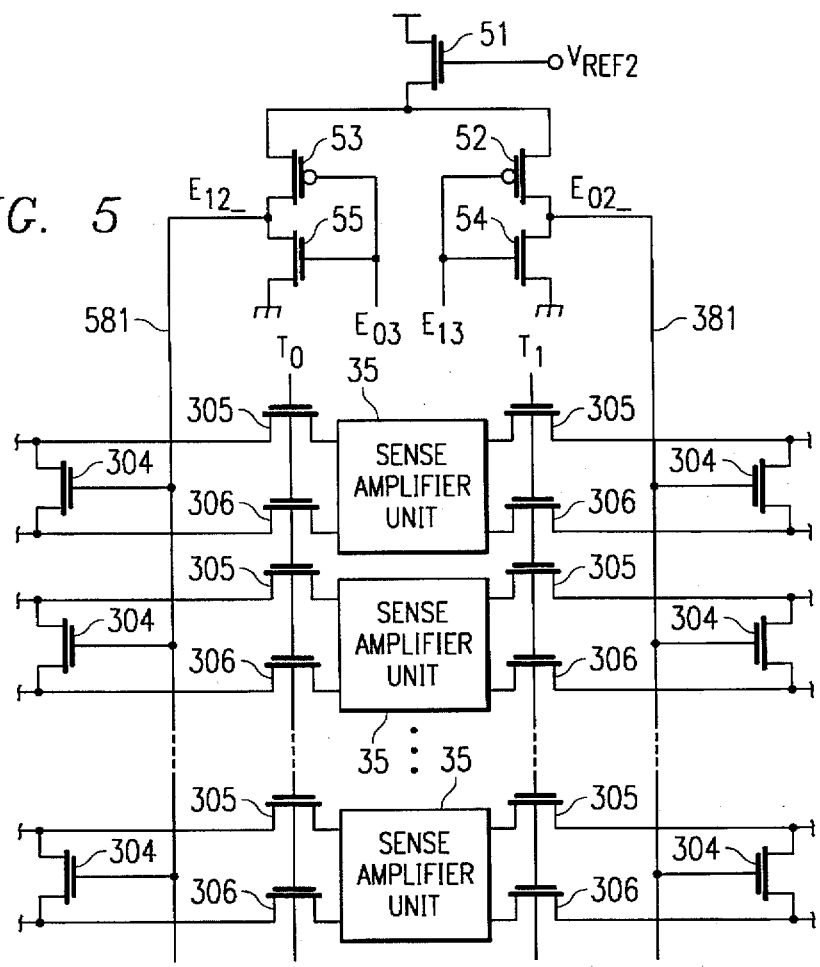
FIG. 5 is a schematic diagram illustrating the application of the present invention to a normal memory array.

Referring to FIG. 5, apparatus for generating and $E_{02}$__ and an $E_{12}$__signal is shown. The $E_{02}$__and the $E_{12}$__signals are used to reduce the leakage currents in two sets circuits similar to those shown in FIG. 3, the two sets of circuits being symmetrically located with respect to the sense amplifier units. N-channel field effect transistor 51 has a first source-drain path terminal coupled to a supply voltage and a gate terminal coupled to a $V_{REF2}$ voltage supply. A second source-drain path terminal of transistor 51 is coupled to a first source-drain path terminal of a p-channel field effect transistor 52 and first source-drain path terminal of a p-channel field effect transistor 53. A second source-drain path terminal of transistor 52 is coupled to conductor 381' (which distributes the $E_{02}$__signal) and to a first source-drain path terminal of n-channel field effect transistor 54. A second source-drain path terminal of transistor 53 is coupled to a first source-drain path terminal of n-channel field effect transistor 55 and to conductor 581 (which distributes the $E_{12}$__signal). The second source-drain path terminal of transistor 54 is coupled to the ground potential, while the second source-drain path terminal of transistor 55 is also coupled to the ground potential. An $E_{13}$__signal is applied to a gate terminal of transistor 52 and transistor 54, while an $E_{03}$ signal is applied to a gate terminal of transistor 53 and to a gate terminal of transistor 55.

Figure 6:
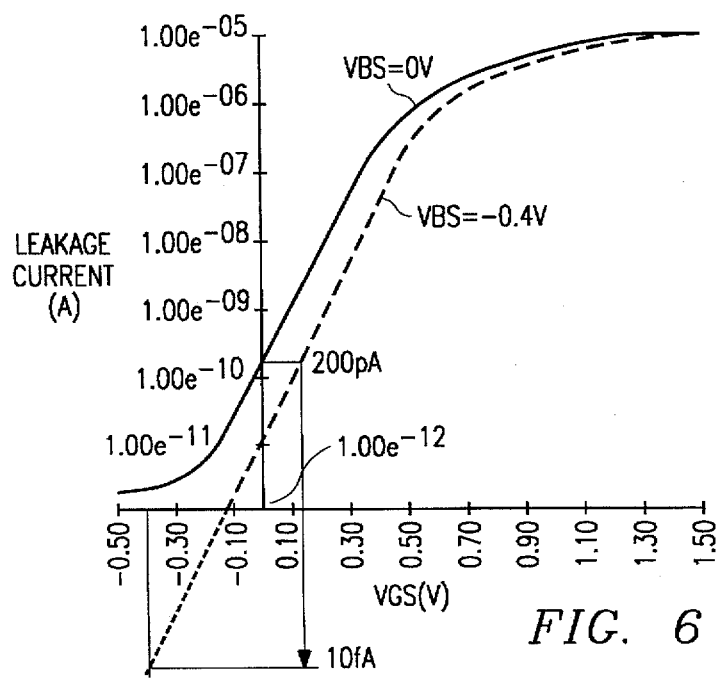
FIG. 6 is a graph illustrating the reduction of leakage current in a storage cell of a dynamic random access memory unit according to the present invention.

Referring to FIG. 6, the reduction of the leakage current resulting from the imposition of a small negative bulk-source voltage ($V_{BS}$) negative base-to-source (VBS) and negative gate-to-source (VGS) voltage as compared to a zero base-source voltage for a memory cell is shown. The leakage current can be reduced, the present invention, to 1/5000 of the value without the implementation of the present invention.

2. Operation of the Preferred Embodiment(s)

In a random access memory unit, the leakage current is a significant problem in the situation where the non-selected storage cell capacitor is charged to a level representing a logic "1" state, the coupled bitline has been driven by the coupled sense amplifier unit to zero potential, and the pass transistor coupling the charged storage cell and the bitline is non-conducting because of the application of a zero voltage to the gate terminal of the pass transistor. The leakage current problem reaches unacceptable values notwithstanding the cut-off of the pass transistor. Because the bulk-to-source potential ($V_{BS}$) is more effective at limiting the leakage current, in the past, the base has been biased at a negative potential. This biasing technique, while effective, had undesirable circuit implications.

The present invention provides a negative bulk-to-source and negative gate-to-source and a negative gate-to-source bias by providing a small positive potential to the source terminal. This positive bias is provided through the coupled bitline. The voltage of the bitline, normally zero, is raised to a small positive value (after the bitline has been electrically isolated from the sense amplifier). The small positive voltage on the bitline/source terminal results in a negative bulk-to-source and a negative gate-to-source potential, thereby more effectively reducing the leakage current.

The positive potential is applied to the bitline, in the preferred embodiment, by a coupling transistor between the bitline pair. After the sense amplifier unit has driven the bitline pair to the maximum potential difference, the bitlines are then isolated from the sense amplifier. A small positive bias voltage is applied to the gate terminal of the charging transistor. As a result of this gate potential, the zero potential bitline is increased slightly (i.e., approximately 0.4 volts in the circuits in which the present invention has been incorporated). The bitline at the higher potential (i.e., approximately 5 volts in the circuit in which the present invention is incorporated) has been lowered by a similar value. One advantage of the present invention is that little additional power is required to change the potential of the zero potential bitline, the power (i.e., charge being provided from the higher potential bitline.

In practical amplications, each sense amplifier can be coupled to two bitline pairs as shown in FIG. 5. As shown in FIG. 5, the apparatus providing the small voltages ($E_{02}$__ or $E_{12}$__) can be coupled to the gates of a plurality of coupling transistors, each coupling transistor connecting an associated bitline pair. The actual charge applied to the bitline pair will bedetermined by storage cell addressing signals.

As will be clear to those skilled in the art of dynamic random access memory units, the $E_{01}$ signal initializes the bitline pair to the potential determined by the voltage applied to the BLR line, each of the bitline pair having the same potential. A $W_0$ through $W_{N-1}$ signal on a word line activates a selected pass transistor which couples the associated storage cell capacitor to one of the bitline pair. The coupled capacitor creates a small voltage difference between the bitlines. The sense amplifier is then activated by the NC signal, amplifies the difference in voltage, thereby driving one bitline to approximately the supply potential (5 volts) and the other bit line to approximately zero potential (0 volts). The $T_O$ signal electrically isolates the bitlines from the sense amplifier unit and the $E_{02}$_signal, initially 0 volts (i.e., causing the coupling transistor 304 to be non-conducting), is raised to a small fraction of the supply voltage (approximately 0.4 volts in the embodiment in which the present invention has been implemented). The small voltage results in a negative bulk-to-source and negative gate-to-source voltage and results in a substantial reduction of the leakage current through the pass transistor.

While the invention has been described with particular reference to the preferred embodiment, it will be understood by those skilled in the art that various changes may be made and equivalents substituted for elements of the preferred embodiment without departing from the invention. For example, the invention was explained by assuming an n-channel storage cell (i.e., an n-channel pass gate and an n-channel MOS capacitor). The same concept can be applied to a p-channel storage cell (i.e., a p-channel pass gate and a p-channel channel MOS capacitor) by changing the polaarity of the applied signal potential. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. A method for reducing the leakage current from a storage cell capacitor in a dynamic random access memory when a charged storage cell capacitor is isolated from a zero potential bitline by a pass transistor, said bitline potential being determined by a sense amplifier unit, said method comprising the steps of:

electrically isolating said zero potential bitline from an associated sense amplifier unit; and raising said zero potential bitline by a small voltage increment thereby creating a negative base-to-source potential for said pass transistor.

2. The method of claim 1 wherein said pass transistor and said storage cell capacitor are implemented using p-channel semiconductor technology.

3. The method of claim 1 wherein said pass transistor and said storage cell capacitor are implemented using n-channel semiconductor technology.

4. The method of claim 1 wherein said small voltage is a fraction of half of a supply voltage.

5. The method of claim 3 wherein said isolating step includes a step of electrically isolating a high potential bitline from said associated bitline, and wherein said raising step includes the step of transferring charge from said high potential bitline to said zero potential bitline.

6. The method of claim 4 wherein a coupling transistor is coupled between said high potential and from said zero potential bitline, said raising step includes the step of applying a voltage to a gate of said coupling transistor.

7. A dynamic random access memory unit having a plurality of memory circuits, said memory circuits comprising:

a sense amplifier;

a first and a second bitline coupled to said sense amplifier;

a storage cell unit including a storage cell capacitor and a pass transistor coupling said storage cell capacitor to said first bitline;

a transistor coupled between said first and said second bitlines, said transistor having a gate terminal responsive to a bias voltage permitting charge to be transferred between said first and said second bitlines; and wherein said transfer of charge causes a voltage on said first bitline to rise and wherein said transfer of charge causes a bulk-to-source and a gate-to-source voltage of said pass transistor to become negative.

8. The memory unit of claim 7 wherein said storage cell unit is implemented using n-channel semiconductor technology.

9. The memory unit of claim 7 wherein said storage cell unit is implemented using p-channel semiconductor technology.

10. The memory unit of claim 7 wherein said bias voltage is a fraction of half of a supply voltage.

11. The memory unit of claim 7, said memory circuits further comprising:

isolation elements for electrically isolating said first and second bitlines from said sense amplifier in response to a control signal.

12. The memory unit of claim 11, said memory circuits further comprising:

a second first and second second bitline coupled to said sense amplifier;

a second storage cell unit including a second storage cell capacitor and a second pass transistor coupling said second storage cell capacitor to said second first bitline, and a second transistor coupled between said second first and said second second bitlines, said second transistor having a gate terminal responsive to a second bias voltage permitting charge to be transferred between said second first and said second second bitlines.

13. The memory unit of claim 12, said memory circuit further comprising second isolation circuits.

14. An semiconductor memory circuit for storing a charge state representative of a logic state, said memory circuit comprising:

a sense amplifier;

a bitline pair coupled to said sense amplifier, said sense amplifier amplifying differences in voltages between said bitlines when a control signal is applied thereto, said bitline pair being initialized to an equal potential;

at least one storage cell coupled to each bitline of said bitline pair, said storage cell including;

a storage cell capacitor, and a pass transistor coupled between said storage cell capacitor and said coupled bitline, said pass transistor providing a conducting path between said coupled bitline and said storage cell capacitor when a select signal is applied to a gate of said pass transistor; and a coupling transistor coupled between each bitline of said bitline pair, wherein a first signal applied tea gate terminal of said coupling transistor reduces a voltage difference between said bitline pair, said reduced voltage difference resulting in a negative base-to-source and gate-to-source voltage for said pass transistor when said pass transistor does not have said select signal applied thereto.

15. The memory circuit of claim 14 wherein said storage cell is implemented using n-channel semiconductor technology.

16. The memory circuit of claim 14 wherein said storage cell is implemented using p-channel semiconductor technology.

17. The memory circuit of claim 14 wherein said reduced voltage difference results in less leakage current from said storage cell capacitor when said storage cell capacitor has a charge stored thereon.

18. The memory circuit of claim 14 further comprising uncoupling components between said sense amplifier and each bitline of said bitline pair, said uncoupling components electrically isolating said bitline pair from said sense amplifier in response to a second signal.

19. The memory circuit of claim 18 further comprising apparatus for equalizing voltages of each bitline of said bitline pair.

20. The memory circuit of claim 19 further including dummy capacitors coupled to each bitline of said bitline pair.

21. The memory circuit of claim 14 further comprising:

a second bitline pair coupled to said sense amplifier;

at least one second storage cell coupled to each bitline of said second bitline pair, said storage cell including;

a second storage cell capacitor, and a second pass transistor coupled between said second storage cell capacitor and said coupled bitline of said coupled bitline pair; and a second coupling transistor coupled between each bitline of said second bitline pair.

22. The memory circuit of claim 17 further comprising apparatus for providing said first signal, said first signal having a value of a fraction of one half of a supply voltage.

* * * * *